(12) United States Patent
Fangman

(10) Patent No.: US 8,937,270 B2
(45) Date of Patent: Jan. 20, 2015

(54) CALIBRATION SYSTEM FOR SOLAR COLLECTOR INSTALLATION

(71) Applicant: CEWA Technologies, Inc., Wyomissing, PA (US)

(72) Inventor: Michael E. Fangman, Reading, PA (US)

(73) Assignee: CEWA Technologies, Inc., Bethlehem, PA (US)

( * ) Notice: Subject to any disclaimer, the term of this patent is extended or adjusted under 35 U.S.C. 154(b) by 0 days.

(21) Appl. No.: 13/897,268

(22) Filed: May 17, 2013

(65) Prior Publication Data

US 2013/0247899 A1 Sep. 26, 2013

Related U.S. Application Data

(63) Continuation of application No. 12/841,360, filed on Jul. 22, 2010, now Pat. No. 8,466,400.

(60) Provisional application No. 61/228,440, filed on Jul. 24, 2009.

(51) Int. Cl.
| | |
|---|---|
| *G01J 1/20* | (2006.01) |
| *F24J 2/38* | (2014.01) |
| *H01L 31/0525* | (2014.01) |
| *F24J 2/10* | (2006.01) |
| *F24J 2/12* | (2006.01) |

(Continued)

(52) U.S. Cl.
CPC ............ *H01L 31/058* (2013.01); *F24J 2/1047* (2013.01); *F24J 2/1057* (2013.01); *F24J 2/12* (2013.01); *F24J 2/18* (2013.01); *H01L 31/0522* (2013.01); *F24J 2/38* (2013.01); *H02S 40/00* (2013.01); *F24J 2002/1085* (2013.01); *F24J 2002/385* (2013.01); *Y02B 10/20* (2013.01); *Y02E 10/42* (2013.01); *Y02E 10/52* (2013.01); *Y02E 10/47* (2013.01)
USPC .................. 250/203.4; 136/244; 136/246

(58) Field of Classification Search
USPC ................ 250/203.4; 136/244, 246, 291
See application file for complete search history.

(56) References Cited

U.S. PATENT DOCUMENTS

| | | | |
|---|---|---|---|
| 3,861,379 A | 1/1975 | Anderson et al. | |
| 4,146,785 A | 3/1979 | Neale | |

(Continued)

FOREIGN PATENT DOCUMENTS

DE 102006053758 A1 5/2008

OTHER PUBLICATIONS

European Search Report and Examiner's Opinion, dated Apr. 22, 2014 issued in related European Application No. 10802931.5, filed Jul. 23, 2010.

*Primary Examiner* — Tony Ko
(74) *Attorney, Agent, or Firm* — Dickinson Wright PLLC

(57) ABSTRACT

A solar concentrator calibration tool that compensates for inconsistencies in the fabrication, assembly and installation of a solar collector system, permitting the solar collector to perform optimally. The calibration tool provides feedback information to a supervisory control processor, allowing the processor to compare the expected position of the sun to the "actual" position found by the calibration tool. The processor then generates a calibration signal, thereafter used by the collector's movement control mechanism, to compensate the tracking of the solar collector to accurately follow the movement of the sun, unconstrained by the effects of the construction inconsistencies.

16 Claims, 3 Drawing Sheets

(51) Int. Cl.
*F24J 2/18* (2006.01)
*H01L 31/052* (2014.01)
*H01L 31/042* (2014.01)

(56) References Cited

U.S. PATENT DOCUMENTS

| | | |
|---|---|---|
| 4,215,410 A | 7/1980 | Weslow et al. |
| 4,314,546 A | 2/1982 | Miller |
| 4,425,905 A | 1/1984 | Mori |
| 4,548,195 A | 10/1985 | Balhorn |
| 4,564,275 A | 1/1986 | Stone |
| 5,862,799 A | 1/1999 | Yogev et al. |
| 5,919,314 A | 7/1999 | Kim |
| 6,680,693 B2 | 1/2004 | Urban et al. |
| 6,688,303 B2 | 2/2004 | Davenport et al. |
| 6,704,607 B2 | 3/2004 | Stone et al. |
| 6,959,993 B2 | 11/2005 | Gross et al. |
| 6,988,809 B2 | 1/2006 | Rabinowitz |
| 7,109,461 B2 | 9/2006 | Lasich |
| 7,432,488 B1 | 10/2008 | Hines et al. |
| 7,501,572 B1 | 3/2009 | Rabinowitz |
| 2007/0070531 A1 | 3/2007 | Lu |
| 2008/0029151 A1 | 2/2008 | McGlynn et al. |
| 2008/0236568 A1 | 10/2008 | Hickerson et al. |
| 2009/0050191 A1 | 2/2009 | Young et al. |
| 2009/0095342 A1 | 4/2009 | Lin et al. |
| 2009/0159113 A1 * | 6/2009 | Morimoto ............... 136/244 |
| 2010/0000519 A1 | 1/2010 | Zalusky et al. |
| 2010/0059042 A1 | 3/2010 | Chang et al. |

* cited by examiner

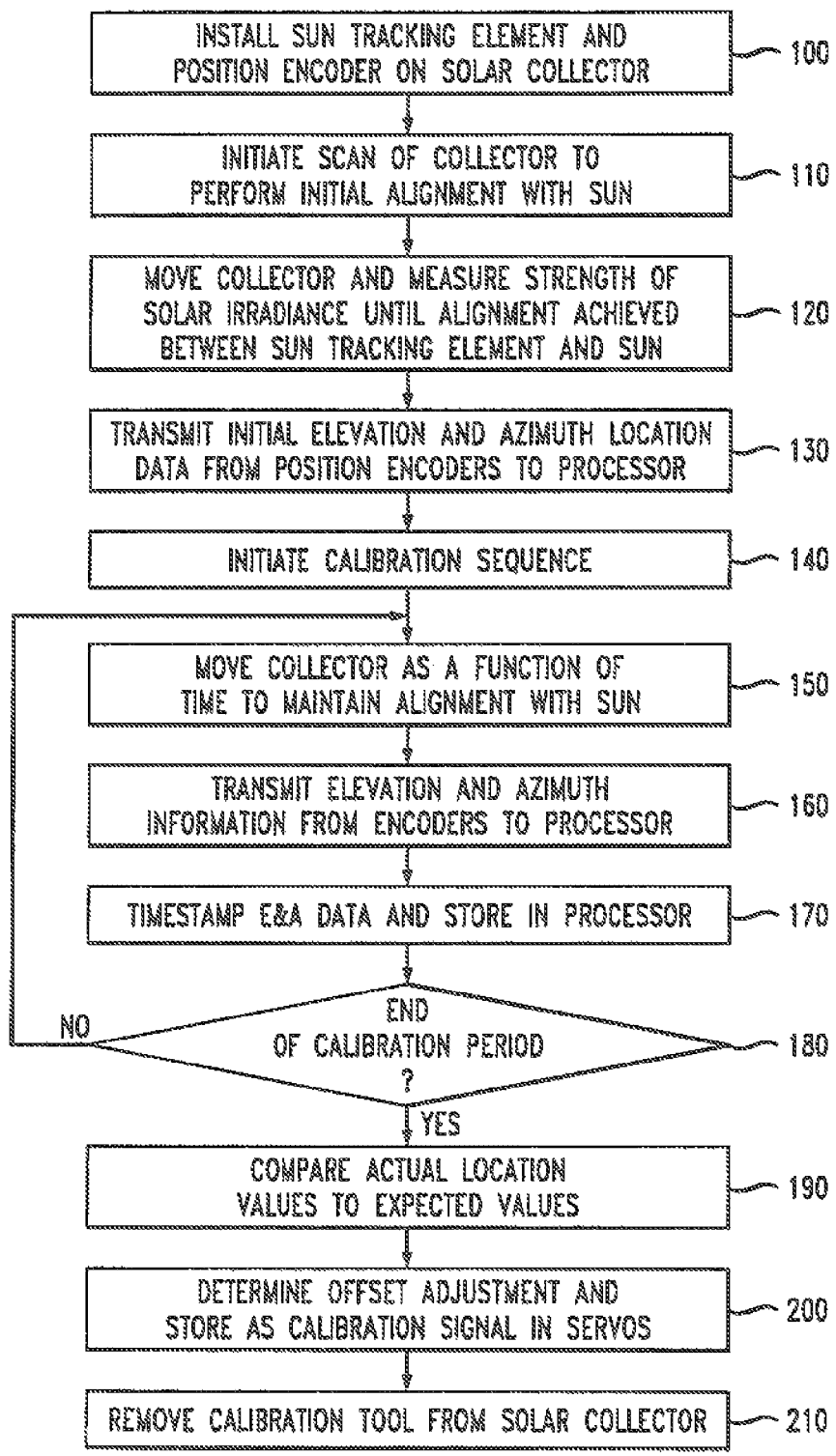

CALIBRATION SYSTEM FOR SOLAR COLLECTOR INSTALLATION

CROSS-REFERENCE TO RELATED APPLICATION

This application is a Continuation of U.S. application Ser. No. 12/841,360, filed Jul. 22, 2010, now pending, which claims the benefit of U.S. Provisional Application No. 61/228,440, filed Jul. 24, 2009 and herein incorporated by reference.

TECHNICAL FIELD

The present invention relates to the installation of a solar collector and, more particularly, to a system for providing alignment between the sun and the collector, regardless of the physical characteristics of the solar collector support system.

BACKGROUND OF THE INVENTION

In the increasingly important field of renewable energy production, solar power is a highly promising technology. In some cases, this technology employs solar cells, also known as photovoltaic (PV) cells, to convert solar radiation into direct current electricity. Solar cells may be arranged into arrays of flat panels, in which sunlight directly impinges upon large surface areas of solar cells. Or, solar cells may be used in photovoltaic concentrators, in which mirrors and lenses reflect and focus solar energy onto a much smaller solar cell. In other cases, solar irradiance is concentrated and focused onto a cavity receiver to produce thermal energy. While the efficiency of any solar power system is largely quantified by the ability of the concentrator to convert solar energy into electricity, the ability of the solar energy system to track the sun's movements also has large effect on a solar power system's efficiency. That is, it remains an important consideration in solar energy systems to be able to effectively and efficiently adjust the angle of the solar panel/collector to maximize the intensity of the sunlight being collected.

One type of tracking system utilizes pedestal-mounted designs, in which a solar module is generally mounted on a vertical pole, or pedestal, which is itself inserted into the ground. Various mechanical linkages and motors are then used to tilt the panel on the support pole in one or two axes according to the sun's movements.

In addition to pedestal-mounted designs, many other tracking systems have utilized combinations of sliding rails, pin joints, ball-and-sockets, rotating wheels, and more. These non-pedestal designs involve multiple supports, typically located around the perimeter of the solar module, to anchor and control the module's movement. For instance, one prior art arrangement comprises a circular, ring-mounted reflector which is supported by a pair of diametrically-opposing levers, with a third lever located below and mid-way between the connections of the lever pair. The three levers use an assembly of linkages to turn the reflector to its desired position, which can include turning the reflector face-down to a protective stowed position.

While numerous tracking systems have been designed and implemented, problems remain with site preparation, "stackup" tolerances as a result of the solar collector fabrication and assembly, as well as with the installation of the collector itself at the site. That is, solar collectors require the construction of a precise foundation and subsequent optical alignment in order to accurately align the collector with the sun during installation and thereafter track the sun's motion across the sky. The high costs associated with site preparation and fabrication of such a foundation impacts the economic viability of installing large-area solar collector fields (that is, an installation of a large number of separate collectors which are then operated as a "system").

SUMMARY OF THE INVENTION

The need remaining in the prior art is addressed by the present invention, which relates to the installation of a solar collector and, more particularly, to a calibration tool and procedure for creating "custom" tracking information that compensates for inaccuracies in an individual solar collector installation, thus maintaining alignment between the sun and the installed solar collector, regardless of various imperfections in the solar collector construction and installation.

In particular, the calibration tool of the present invention comprises a system that is removably attached to a solar collector system upon installation. The tool performs a calibration function by: (1) collecting a body of data defining the locations of a collector as it initially moves to track the sun's movement; (2) comparing this actual movement data with "expected" movement data (taken from standard solar charts and latitude/longitude information); (3) creating an adjustment "overlay" (in the form of the "difference" between these two sets of data); and (4) storing the overlay information within the collector's movement control mechanism.

The calibration tool comprises an alignment element (removably attached to the collector) used to sense the optimum alignment between the collector and the sun at any given point in time, a position encoder (also attached to the collector) to generate the collector's elevation and latitude information (in general, "position information") at any given point in time, and a processor that collects and utilizes the information from both the alignment element and the position encoder, in conjunction with the "expected" sun movement information, to determine the offset between the actual and expected values and thereby generate the calibration information (offset data) used by the servomechanisms to control the movement of the collector.

In operation, the calibration tool functions to initially provide alignment between the sun and the collector and determine the initial position information (e.g., elevation and azimuth) of the collector. Thereafter, a calibration routine (stored in the processor) is followed for a period of time sufficient to determine the offset between the expected location of the sun (relative to the optical axis of the collector—from known reference sources) and the actual location of the sun (relative to the optical axis of the collector—from the position encoder data). The offset information is used by the processor to determine the calibration adjustment that will be required to be performed by the collector's servomechanisms to keep that particular collector in alignment with the sun's path. The information is then transferred to the servomechanisms and the calibration tool is removed from the collector.

It is an advantage of the arrangement of the present invention that the calibration tool is only required upon initial installation of a solar collector. Once the calibration is performed, the tool may be removed and is ready for use with another collector installation.

Moreover, the use of a calibration tool to perfect the alignment between the sun and the collector has been found to reduce the accuracy required in preparing the installation site, constructing the individual components of the system and building the system in the field. These reductions yield a significant cost savings over prior art arrangements that relied on precise alignment upon installation.

Other and further aspects and embodiments of the present invention will become apparent during the course of the following discussion and by reference to the accompanying drawings.

BRIEF DESCRIPTION OF THE DRAWINGS

Referring now to the drawings,

FIG. 4 is a flowchart illustrating an exemplary process of performing solar collector calibration in accordance with the present invention.

DETAILED DESCRIPTION

Figure 1:
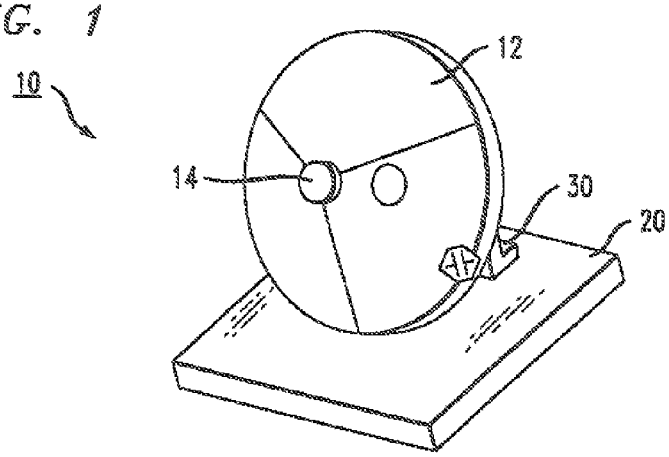
FIG. 1 illustrates an exemplary solar collector that may utilize the calibration tool of the present invention.
Figure 2:
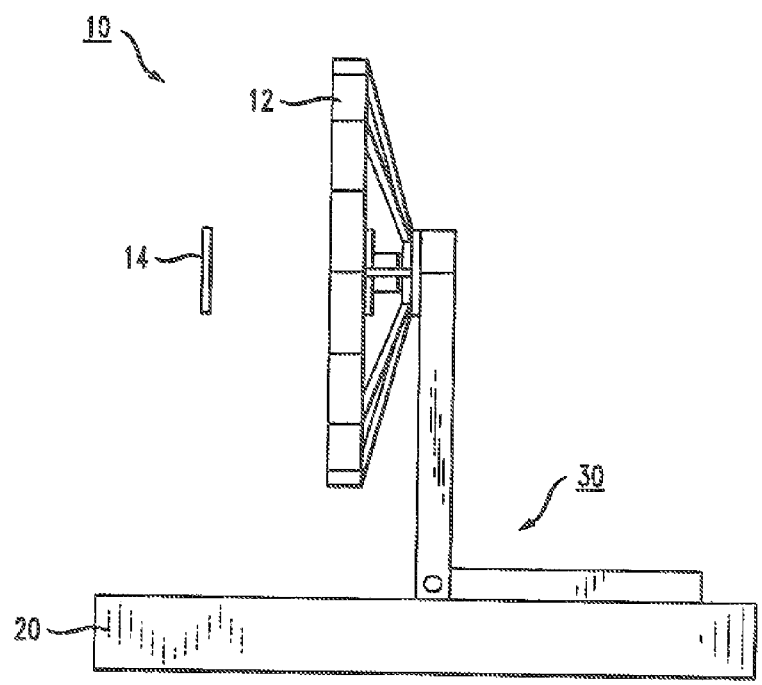
FIG. 2 is a side view of the collector of FIG. 1.

FIG. 1 is a simple illustration of an exemplary solar collector 10 that can be calibrated with the system of the present invention to provide a tracking program that overcomes imperfections that may exist in the system components, installation site preparation and/or on-site construction of the solar collector itself. In this particular example, solar collector 10 includes a concentrating reflector 12 for re-directing impinging solar radiation onto a receiver 14 (or a secondary reflector positioned at that location). At an installation site, collector 10 may be attached to, for example, a concrete pad 20, or similar support structure. A mounting structure 30 is used to attach collector 10 to pad 20. Although not explicitly shown in this view, structure 30 also includes servomechanisms used to move collector 10 so as to track the sun's movement during the course of the day. A side view of the arrangement of FIG. 1 is shown in FIG. 2, which illustrates a particular configuration of mounting structure 30. As discussed above, the variations in site preparation and concentrator assembly will impact the alignment between collector 10 and the sun. For example, a "level" platform upon which to mount a collector should not exhibit an offset from "level" no greater than "millimeters" over a platform several meters in width. Variations in the dimensions of mounting structure 30 may also impact the alignment between collector 10 and the sun.

Figure 3:
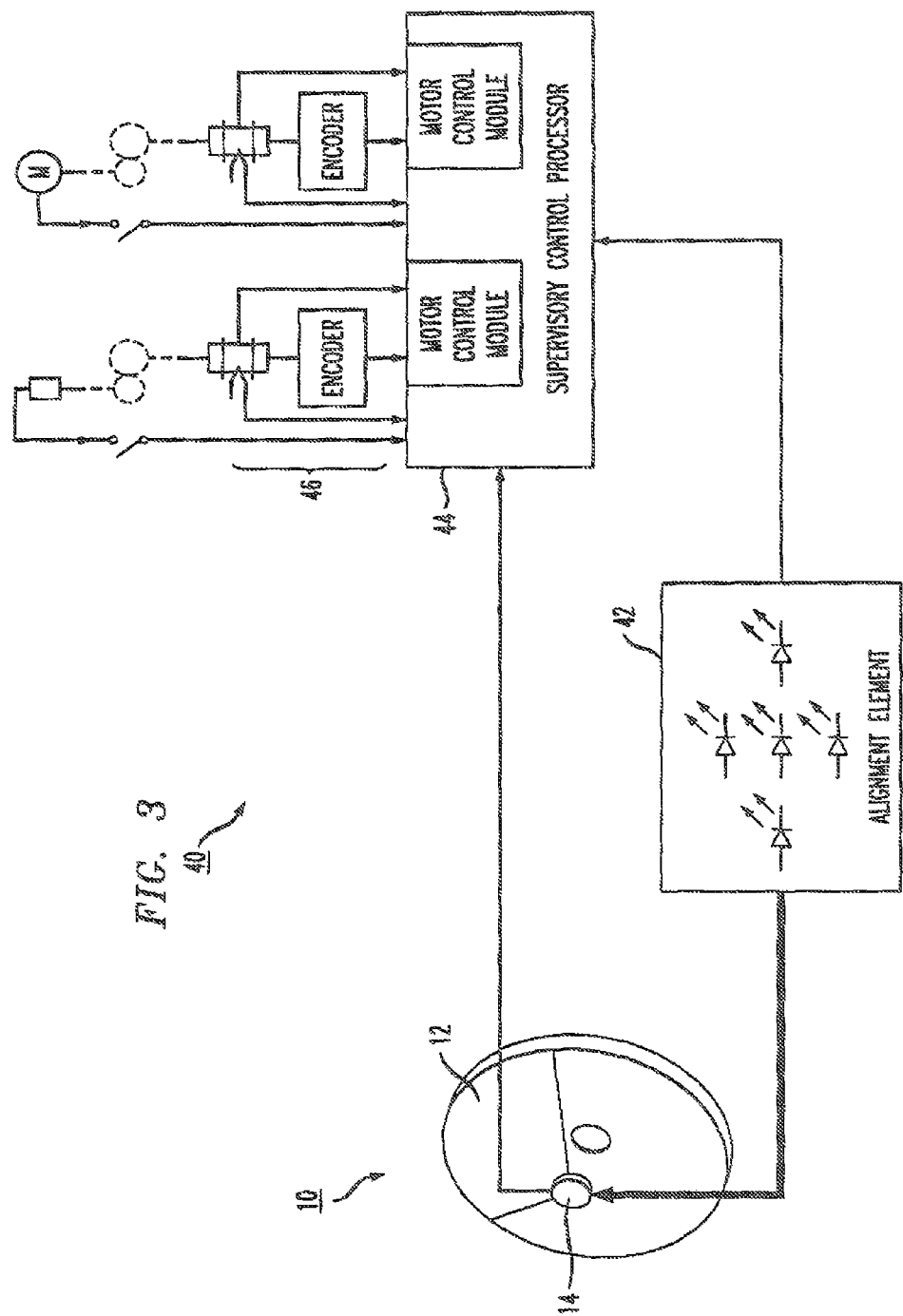
FIG. 3 is a diagram of an exemplary calibration tool formed in accordance with the present invention.

FIG. 3 illustrates an exemplary calibration tool 40 formed in accordance with the present invention to provide for a correction between the expected path of the sun's movements and the "actual" locations of the sun observed by receiver 14 as collector 10 moves to maintain alignment. As discussed above, the difference between the expected and actual values can be attributed to a variety of factors including, but not limited to, imperfections in the pad upon which the collector is installed, misalignment between system components, imperfections in the construction of the individual system components and/or construction imperfections in the actual installation of the solar collector system in the field. Calibration tool 40 is not permanently attached to solar collector 10, but is only used upon installation to determine the offset between the predicted and actual values and create an adjustment signal thereafter used by the collectors servomechanisms to control the movement of collector 10. Thereafter, calibration tool 40 is removed.

As shown in FIG. 3, calibration tool 40 includes an alignment element 42, a processor 44 and a position encoder 46. Alignment element 42 is used to periodically re-adjust the position of collector 10 to maintain the collectors optical axis in alignment with the location of the sun. In one embodiment, alignment element 42 comprises a quadrant photodiode sensor array that will create a series of electrical output signals based upon the amount of solar radiation received by the array. Various other types of arrangements may be used to form alignment element 42 including, but not limited to, a matrix configuration of photodiodes, a set of thermocouples, a camera; in general, any type of instrumentation that will be affected by radiation from the sun.

Processor 44 includes a control program that will cause the collector to adjust its position until alignment between the sun and alignment element 42 is achieved (i.e., when "maximum" solar radiance is measured by, for example, a photodiode array). Once alignment is achieved, the actual location information associated with the position of collector 10 (in terms of elevation and azimuth data) are recorded by position encoder 46 and transmitted to processor 44.

With this understanding of the operation of the elements forming calibration tool 40, an exemplary calibration process as performed in accordance with the present invention will now be described in detail.

FIG. 4 contains a flowchart of an exemplary process that can be used to Implement the calibration process as provided in accordance with the present invention. The process begins at step 100 with the attachment of alignment element 42 and position encoder 46 to the solar collector system. In order to properly calibrate the alignment of the collector system with the location of the sun, alignment element 42 needs to be positioned along the optical axis of the system. In a preferred embodiment, alignment element 42 is positioned at receiver 14, allowing for its relatively straightforward attachment and later removal.

Once these elements are in place, the calibration process starts with an initial scan movement of collector 10 (step 110) and measurement of the optical signal (sun's radiance) impinging alignment element 42. This step can be thought of as a "centering" process to initially line up receiver 14 of the solar collector system with the position of the sun. As shown in step 120, the movement of collector 10 (under the control of the servomechanisms included in mounting structure 30) continues, with the power of the optical signal captured by alignment element 42 being transmitted to processor 44 until a signal associated with optimum alignment is achieved (e.g., maximum solar power is measured). At this point, an initial registration of collector 10 with the suns location has been accomplished, and the location of collector 10 (elevation and azimuth) is transmitted from position encoders 46 to processor 44 (step 130).

Inasmuch as the sun continuously traverses a path across the horizon, collector 10 must remain aligned with the sun's position to continue to receive maximum radiance. The art is replete with systems that provide such tracking, as mentioned above. However, these systems are known to utilize only the 'predicted' or 'expected' movement of the sun (for a given geographic location, time of year, etc.) and do not take into account any irregularities introduced into the tracking by the imperfections in the solar collector system itself. It is the purpose of the present invention to understand these irregularities and calibrate the "path" followed by the collector so as to remain in alignment with the actual location of the sun.

Thus, the calibration process of the present invention continues at step 140 with the initiation of the calibration sequence. The sequence begins with the movement of collector 10 continuing to be controlled, for a predetermined period of time, by measuring the optical signal received by alignment element 42 so as to maintain alignment with the sun (step 150). As each movement is performed, the solar collectors location information from position encoders 46 (e.g., elevation and azimuth) is transmitted to processor 44 (step 160), which appends a timestamp to this location data and stores it in an included memory module (step 170).

At this point, a decision is made (step 180) to determine if the calibration time period has expired. Presuming the calibration period has not expired, the process returns to step 150, where the position of the collector is again re-aligned with the sun (using feedback from alignment element 42) and the associated elevation and azimuth information is transmitted to processor 44.

By repeating these steps for a predetermined period of time (measured in, perhaps, hours or minutes), a body of data is created that defines the actual position of the sun with respect to collector 10 that is required to maintain alignment therebetween. Once a sufficient amount of data has been gathered (as determined by the individual performing the calibration), the process moves on to step 190, where processor 44 functions to compare the collected actual data regarding the elevation and azimuth of the sun to the expected values associated with the geographic information stored therein.

Inasmuch as any installed solar collector will have one or more imperfections, the actual and predicted values will be different. Processor 44 then functions to determine this difference as an offset adjustment that needs to be made to the expected values of the sun's movements (associated with the movement over the course of an entire year) and transmits this offset adjustment as a calibration signal to the servomechanisms associated with mounting structure 30 (step 200). Once the calibration information has been stored in the servomechanisms, the calibration process is finished, and alignment element 42 and position encoder 46 are removed from the solar collector system (step 210).

It is to be understood that calibration tool 40 may be extended to control a network of solar concentrators that have been co-located in a distributed fashion across an 'open field' area. In conventional arrangements, such concentrator arrays have to compromise between land usage and shadowing of neighboring concentrators. Solar thermal collection is conducted only when the sun is 30 degrees off the horizon, resulting in an average of 6.25 hours/day of solar collection over the year. The control/tracking method of the present invention can be configured to raise the dishes in sequence as the sun breaks the horizon without shadowing. This would result in a 4% increase in annual capacity factor.

While the invention has been described with reference to the preferred embodiments, obvious modifications and alterations are possible by those skilled in the relevant art. Therefore, it is intended that the invention include all such modifications and alterations to the full extent that they come within the scope of the following claims or equivalents thereof.

What is claimed is:

1. A solar collector alignment calibration tool, comprising:
    an alignment element that generates an alignment signal for a solar collector to maintain an optical axis of the solar collector aligned to a maximum radiation position of a sun, wherein the alignment element comprises a solar sensing array that senses radiation from the sun, and wherein the alignment element is positioned along the optical axis;
    a position encoder that generates elevation and azimuth data of the solar collector including upon alignment of the optical axis with the maximum radiation position;
    a computer-readable storage medium having encoded thereon machine instructions for computing a location difference value; and
    a processing element that executes the program of instructions to:
        read a current expected position of the sun,
        read current elevation and azimuth data of the solar collector generated by the position encoder, and
        compute the location difference value based on the current expected position of the sun and the current elevation and azimuth data.

2. The calibration tool of claim 1, wherein the alignment element generates the alignment signal and the position encoder generates the elevation and azimuth data following a movement tracking of the sun during an alignment calibration process over a predetermined period, and wherein the location difference value is a function of location difference values computed by the processing element during the alignment calibration process over the predetermined period.

3. The calibration tool of claim 2, wherein, following the alignment calibration process, the processing element operates to provide the location difference value to a processor of the solar collector, wherein the processor applies the location difference value as an offset signal to correct between the expected position of the sun and an actual position of the solar collector.

4. The calibration tool of claim 3, wherein the alignment element is removably affixed to the solar collector.

5. The calibration tool of claim 4, wherein the alignment element is removed from the solar collector following the alignment calibration process.

6. The calibration tool of claim 1, wherein the solar collector is in a fixed location relative to Earth.

7. The calibration tool of claim 6, where in the fixed location is a fixed geographic location on Earth.

8. The calibration tool of claim 1, wherein the processing element further operates to generate an adjustment signal to adjust the position of the solar collector based on the location difference value to maintain the optical axis of the solar collector aligned to the maximum radiation position of the sun.

9. The calibration tool of claim 8, wherein the processing element further operates to provide the position adjustments to a motor control module of the solar collector.

10. The calibration tool of claim 1, wherein the expected position of the sun comprises sun movement data based on a latitude and longitude of the solar collector.

11. A calibration tool for aligning an optical axis of a solar collector with a solar emitter during an alignment calibration process, comprising:
    an alignment element that generates an alignment signal usable to drive the solar collector such that the optical axis is aligned with an observed position of the solar emitter to maximize solar radiation reception from the solar emitter, wherein the alignment element comprises a solar sensing array that senses the solar radiation from the solar emitter, and wherein the alignment element is positioned along the optical axis;
    a position encoder that provides a position of the solar collector when the optical axis is aligned with the observed position of the solar emitter; and
    a processor that:
        compares the position of the solar collector when the optical axis is aligned with the observed position of the solar emitter to an expected position of the solar collector defined as a positioned that maximizes collection of solar radiation based on an expected track of the solar emitter, and
        generates a difference value useable to maintain the optical axis of the solar collector in alignment with the solar emitter after execution of the alignment calibration process.

12. The calibration tool of claim 11, wherein the processor:
applies the alignment signal to a solar collector positioning device to drive the optical axis of the solar collector into alignment with the observed position of the solar emitter.

13. A solar collector alignment system, comprising:
an alignment element comprising a solar sensor array positioned along an optical axis of a solar collector that senses solar radiation from a solar emitter and a position difference between a current position of the optical axis of the solar collector and an optimum position of the solar collector defined as a position of the solar collector having maximum solar radiation incidence;
a computer-readable storage medium having stored thereon a program of instructions for aligning a solar collector with the solar emitter; and
a processor when executing the program of instructions:
receives the optimum position,
receives an expected position of the solar collector defined as an expected position of the solar emitter,
computes a difference value defined as a difference between the optimum position and the expected position, and
stores the difference value as an offset to apply to a solar collector positioning signal to provide optimum tracking of movement of the solar emitter by the solar collector.

14. The system of claim 13, further comprising a position element that generates optimum elevation and azimuth data of the solar collector including when the optical axis aligns with the maximum radiation position, wherein the optimum elevation and azimuth comprise the optimum position.

15. The system of claim 14, further comprising an alignment mechanism that drives the optical axis of the solar collector to align with the optimum position.

16. A solar collector alignment system, comprising:
an alignment element comprising a solar sensor array positioned along an optical axis of a solar collector, the solar sensor array sensing solar radiation from a solar emitter and a current position of the optical axis of the solar collector when in optimal alignment with the solar emitter, the optimal alignment defined as a position of the solar collector having maximum solar radiation incidence;
a computer-readable storage medium having stored thereon a program of instructions for aligning the solar collector with the solar emitter; and
a processor that, when executing the program of instructions:
receives the optimum alignment position,
receives an expected position of the solar collector defined as an expected position of the solar emitter with the optical axis of the solar collector aligned with the solar emitter such that the solar collector receives the maximum radiation incidence,
computes a difference value defined as a difference between the optimum position and the expected position, and
stores the difference value as an offset to apply to a solar collector positioning signal to provide optimum tracking of movement of the solar emitter by the solar collector.

* * * * *